(12) United States Patent
Derner et al.

(10) Patent No.: US 9,070,425 B2
(45) Date of Patent: Jun. 30, 2015

(54) DATA LINE CONTROL FOR SENSE AMPLIFIERS

(71) Applicant: Micron Technology, Inc., Boise, ID (US)

(72) Inventors: Scott J. Derner, Boise, ID (US); Charles L. Ingalls, Meridian, ID (US); Howard Kirsch, Eagle, ID (US); Tae H. Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/068,940

(22) Filed: Oct. 31, 2013

(65) Prior Publication Data

US 2015/0117124 A1    Apr. 30, 2015

(51) Int. Cl.
*G11C 7/00* (2006.01)
*G11C 7/08* (2006.01)
*G11C 7/12* (2006.01)

(52) U.S. Cl.
CPC ... *G11C 7/08* (2013.01); *G11C 7/12* (2013.01)

(58) Field of Classification Search
CPC .................. G11C 13/0004; G11C 11/4091
USPC ............................................ 365/189.15, 205
See application file for complete search history.

(56) References Cited

U.S. PATENT DOCUMENTS

| | | | |
|---|---|---|---|
| 4,162,416 A | 7/1979 | Beecham et al. | |
| 4,460,985 A | 7/1984 | Hoffman | |
| 5,390,147 A | 2/1995 | Smarandoiu et al. | |
| 6,411,543 B2 * | 6/2002 | Narui et al. | 365/149 |
| 6,426,905 B1 | 7/2002 | Dennard et al. | |
| 7,388,400 B2 * | 6/2008 | Sakata et al. | 326/34 |
| 7,535,282 B2 | 5/2009 | Kim et al. | |

* cited by examiner

*Primary Examiner* — Michael Tran
(74) *Attorney, Agent, or Firm* — Schwegman Lundberg & Woessner, P.A.

(57) ABSTRACT

Some embodiments include apparatuses and methods having a first data line, a second data line, a first transistor, a sense amplifier, and a circuit. The first transistor can operate to couple the first data line to a first node during a first stage of an operation of obtaining information from a memory cell associated with the first data line. The second transistor can operate to couple the second data line to a second node during the first stage. The circuit can operate to apply a first signal to a gate of the first transistor during the operation and to apply a second signal to a gate of the second transistor during the operation. The sense amplifier can operate to perform a sense function on the first and second data lines during a second stage of the operation. Additional apparatus and methods are described.

14 Claims, 11 Drawing Sheets

DATA LINE CONTROL FOR SENSE AMPLIFIERS

BACKGROUND

Memory devices are widely used in computers, mobile devices, and many other electronic items. A memory device has numerous memory cells. The memory device can perform a write operation to store information in the memory cells and a read operation to obtain information from the memory cells. The memory device usually has a large number of data lines to carry information, in the form of signals, to and from the memory cells. Some conventional memory devices have sense amplifiers that can perform sense functions on the data lines during a read operation to determine the value of information obtained from the memory cells.

As cell density increases in some memory devices, the number of data lines in these memory devices may also increase. This may decrease the spaces between the data lines. Thus, undesirable capacitive coupling between adjacent data lines may increase. Therefore, if the signals on the data lines during a read operation are improperly controlled, accuracy of sense functions may be affected.

DETAILED DESCRIPTION

Figure 1:
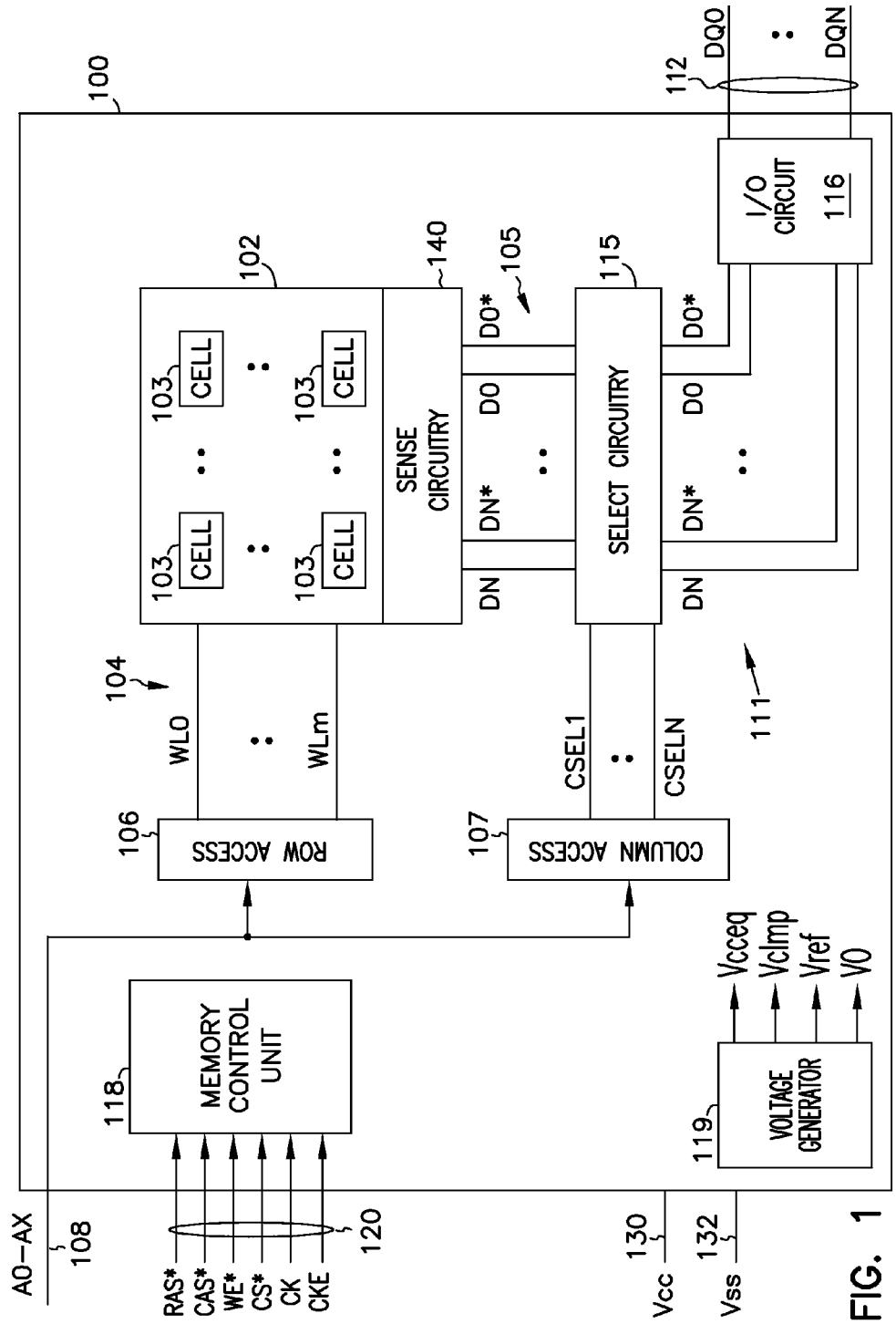
FIG. 1 shows a block diagram of an apparatus in the form of a memory device, according to an embodiment of the invention.

FIG. 1 shows a block diagram of an apparatus in the form of a memory device 100, according to an embodiment of the invention. Memory device 100 can include access lines (e.g., word lines) 104, data lines 105 (e.g., bit lines) and a memory array 102 having memory cells 103 arranged in rows and columns. Access lines 104 can carry signals (e.g., access line signals) WL0 through WLm. Data lines 105 can carry signals (e.g., data line signals) DL0, DL0* through DLN and DLN*. Memory device 100 can use access lines 104 to access memory cells 103. Memory device 100 can use data lines 105 to obtain information from the memory cells 103 and to provide information (e.g., data) to be stored in the memory cells 103.

Memory device 100 can include row and column access circuitry (e.g., decoders) 106 and 107, respectively, that can respond to address signals A0 through AX on lines 108 (e.g., address lines) to determine which memory cells 103 are to be selected in a memory operation. Memory device 100 can perform a memory operation (e.g., a read operation) to obtain information from selected memory cells 103 and can perform another memory operation (e.g., a write operation) to store information in selected memory cells 103.

Memory device 100 can include sense circuitry 140 that performs a charging (e.g., precharging) function and a sensing function on data lines 105 during a memory operation (e.g., a read operation). The charging and sensing functions of memory device 100 can be similar to, or identical to, the charging and sensing functions described in more detail below with reference to FIG. 2 through FIG. 10D.

A memory control unit 118 can control the memory operations (e.g., read and write operations) based on control signals on lines 120. Examples of control signals include a row access strobe signal RAS*, a column access strobe signal CAS*, a write enable signal WE*, a chip select signal CS*, a clock signal CK, and a clock enable signal CKE. A device (e.g., a processor or a memory controller) external to memory device 100 can send different commands (e.g., read or write command) to memory device 100 using different combinations of control signals on lines 120.

Memory device 100 can include lines 130 and 132 to receive supply voltages Vcc and Vss, respectively. Supply voltage Vss can operate at a ground potential (e.g., having a value of approximately zero volts). Supply voltage Vcc can include an external voltage supplied to memory device 100 from an external power source such as a battery or an alternating-current to direct-current (AC-DC) converter circuitry.

Memory device 100 can include a voltage generator 119 to generate voltages, such as voltages Vcceq, Vref, Vclmp, and V0, for use during memory operations of memory device 100.

Memory device 100 can include circuitry 111 having a select circuit 115 that can respond to select signals CSEL0 through CSELN during a memory operation in order to select signals D0, D0*, DN, and DN*. The levels of signals D0, D0*, DN, and DN* can represent the values of information to be provided to (e.g., in a write operation) or obtained from (e.g., in a read operation) memory cells 103. Column access circuit 107 can selectively activate the CSEL0 through CSELN signals based on the address signals A0 through AX. Select circuit 115 can select signals D0, D0*, DN, and DN* and then provide them to an input/output (I/O) circuit 116. I/O circuit 116 can receive signals D0, D0*, DN, and DN* and then provide them to lines 112 as DQ0 and DQN signals.

Memory device 100 may include a dynamic random access memory (DRAM) device, a static random access memory (SRAM) device, a FLASH RAM device, and other memory devices, or a combination of these. Memory device 100 may include other components, which are not shown in FIG. 1 to help focus on the embodiments described herein.

Figure 2:
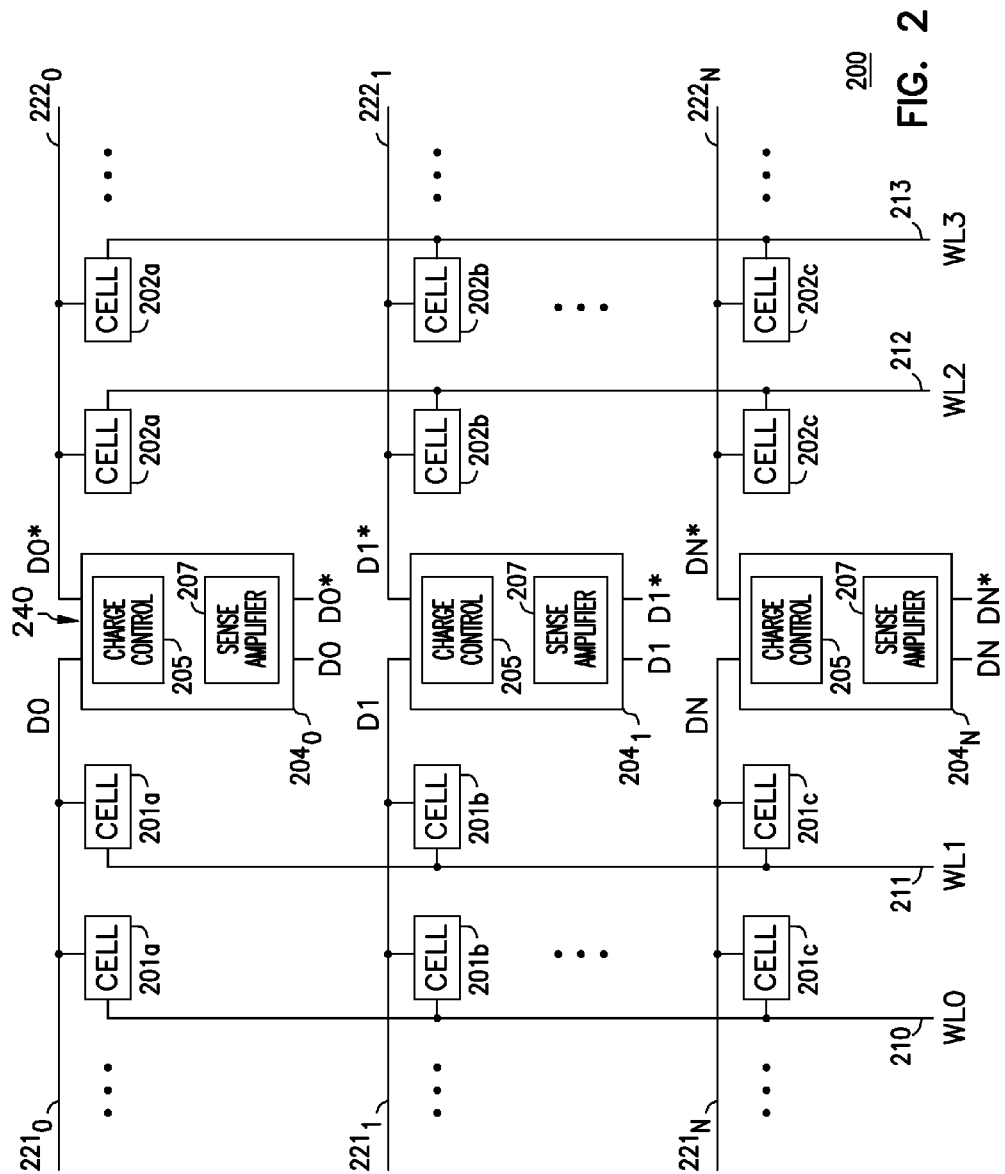
FIG. 2 shows a partial diagram of a memory device having memory cells and sense circuitry, according to an embodiment of the invention.

FIG. 2 shows a partial diagram of a memory device 200 having memory cells 201, 202 and sense circuitry 240, according to an embodiment of the invention. Memory cells 201, 202 and sense circuitry 240 can correspond to memory cells 103 and sense circuitry 140 of memory device 100 of FIG. 1. Memory cells 201 and 202 can be included in the same memory array. Alternatively, memory cells 201 can be included in one memory array of memory device 200 and memory cells 202 can be located in another memory array of memory device 200.

Memory device 200 can include access lines 210, 211, 212, and 213 to receive signals WL0, WL1, WL2, and WL3 during a memory operation (e.g., a read or write operation) to access the memory cells 201 and 202. Memory device 200 can include data lines $221_0$, and $221_1$ through $221_N$ and data lines $222_0$, and $222_1$ through $222_N$ to provide information obtained from memory cells 201 and 202 (e.g., in a read operation) or information to be stored in memory cells 201 and 202 (e.g., in a write operation). The information on data lines $221_0$, and $221_1$ through $221_N$ and data lines $222_0$, and $222_1$ through $222_N$ can be represented by signals D0, D0*, and D1, D1* through DN, DN*.

FIG. 2 shows an example arrangement of the memory cells 201 and 202 with the associated access lines and data lines. Memory cells 201 and 202 and access and data lines in FIG. 2 can be arranged in other arrangements known to those skilled in the art. For example, memory cells 201 and 202 can be arranged in a 4F2 architecture.

As shown in FIG. 2, sense circuitry 240 can include portions $204_0$, and $204_1$ through $204_N$, each of which can include a charge control circuit 205 and a sense amplifier 207. During a memory operation (e.g., a read operation) of memory device 200, charge control circuit 205 and sense amplifier 207 can operate to control charge and to sense signals on corresponding data lines $221_0$, $221_1$ through $221_N$, $222_0$, and $222_1$ through $222_N$. The values of information stored in memory cells 201 and 202 can be determined based on the levels of signals D0, D0*, D1, D1*, and DN, DN* during the memory operation.

The structure and function of charge control circuit 205 and sense amplifier 207 in each of portions $204_0$, and $204_1$ through $204_N$ of FIG. 2, can be similar to, or identical to, those of the charge control circuits and the sense amplifiers described below with reference to FIG. 3 through FIG. 10D.

Figure 3:
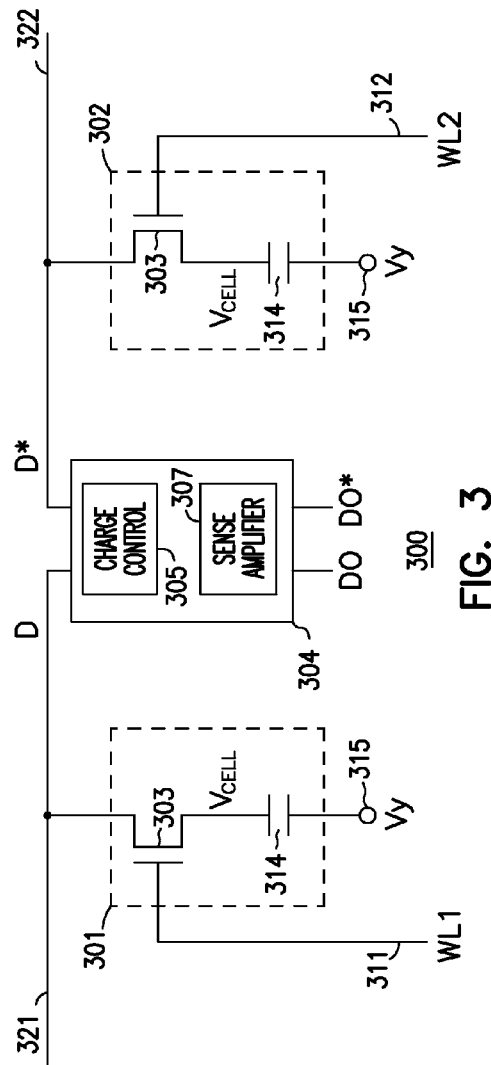
FIG. 3 shows a partial diagram of a memory device, including memory cells and associated access lines, according to an embodiment of the invention.

FIG. 3 shows a partial diagram of a memory device 300, including memory cells 301 and 302 and associated access lines 311 and 312, according to an embodiment of the invention. Each of memory cells 301 and 302 includes an access transistor 303 and a memory element 314 (which can be in the form of a capacitor). One side of memory element 314 can be coupled to a node 315 that can receive a voltage Vy; the other side of memory element 314 can be coupled to access transistor 303. Voltage Vy can have a value approximately equal to a supply voltage (e.g., Vcc) of memory device 300.

Access line 311 can be coupled to the gate of transistor 303 of memory cell 301. Access line 312 can be coupled to the gate of transistor 303 of memory cell 302. Memory device 300 can apply (e.g., activate or deactivate) signals WL1 and WL2 to access lines 311 and 312, respectively, during a memory operation (e.g., a read or write operation).

Memory device 300 can include data lines 321 and 322 associated with memory cells 301 and 302, respectively. Memory device 300 can use data lines 321 and 322 to carry information to and from memory cells 301 and 302, respectively. Information on data lines 321 and 322 can be represented by signals D and D*, respectively.

Memory device 300 can include a charge control circuit 305 and a sense amplifier 307 that can be included in a portion 304, which can be similar to, or identical to, one of portions $204_0$, and $204_1$ through $204_N$ of sense circuitry 240 of FIG. 2.

Figure 4A:
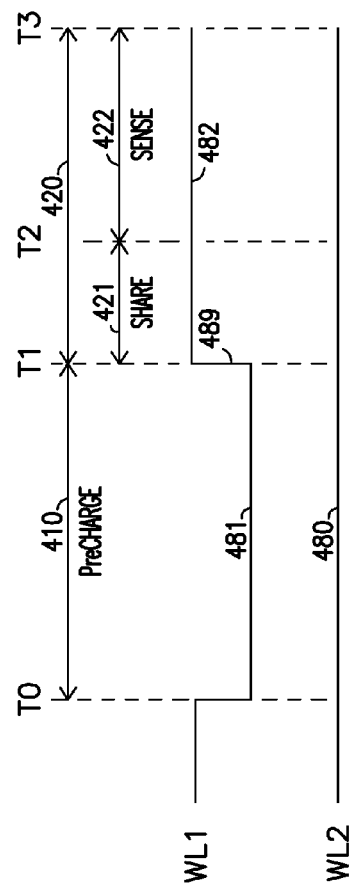
FIG. 4A and FIG. 4B show example timing diagrams, including waveforms of signals on access lines of the memory device of FIG. 3 during a memory operation of the memory device, according to an embodiment of the invention.

FIG. 4A shows an example timing diagram including waveforms of signals WL1 and WL2 during a memory operation (e.g., a read operation) of memory device 300 of FIG. 3, according to an embodiment of the invention. In the example associated with FIG. 4A, memory cell 301 is assumed to be a selected memory cell, and memory cell 302 is assumed to be an unselected (not selected) memory cell. In a read operation of memory device 300, a selected memory cell refers to a memory cell (e.g., memory cell 301) that is selected to obtain (e.g., read) information from it. An unselected memory cell (e.g., memory cell 302) refers to a memory cell that is not selected to obtain information from it. The data line associated with a selected memory cell (e.g., 301) can be referred to as a selected data line. A data line associated with an unselected memory cell (e.g., 302) can be referred to as an unselected data line (or alternatively a reference data line). Thus, in the example associated with FIG. 3 and FIG. 4A where memory cell 301 is a selected memory cell and memory cell 302 is an unselected memory cell, data line 321 can be referred to as the selected data line and data line 322 can be referred to as the unselected data line.

FIG. 4A shows multiple stages of a memory operation (e.g., a read operation) of obtaining information from a selected memory cell (e.g., memory cell 301) of memory device 300. The multiple stages can include a precharge stage (shown in FIG. 4A as "PreCHARGE"), a charge sharing stage (shown in FIG. 4A as "SHARE"), and a sense stage (shown in FIG. 4A as "SENSE").

FIG. 4A also shows a time interval 410 (e.g., between times T0 and T1) and a time interval 420 (e.g., between times T1 and T3). The precharge stage can occur during time interval 410. The charge sharing stage can occur during a portion 421 (e.g., between times T1 and T2) of time interval 420. The sense stage can occur during a portion 422 (e.g., between times T2 and T3) of time interval 420.

As shown in FIG. 4A, signal WL2 can remain unchanged at level 480 during time intervals 410 and 420. Signal WL1 can include different levels, such as a level 481 during time interval 410 and a level 482 during time interval 420. Signal WL1 can be activated such that it has a transition 489 between levels 481 and 482. Level 481 can correspond to ground potential (e.g., zero volts). Level 482 can correspond to a voltage greater than a voltage supply (e.g., Vcc) of memory device 300. Levels 480 and 481 can be the same.

Thus, the precharge stage can occur when signal WL1 has level 481 (e.g., during time interval 410). The charge sharing and sense stages can occur when signal WL1 has level 482 (e.g., during time interval 420).

During time interval 410 and at least a portion of time interval 420 (e.g., during portion 421), charge control circuit 305 (FIG. 3) can operate to control charge on data lines 321 and 322. During at least a portion of time interval 420 (e.g., during portion 422), sense amplifier 307 can perform a sensing function to sense signals D and D* on data lines 321 and 322, respectively. The sensing function can cause signals D and D* to be at appropriate levels (e.g., voltage levels). Additional circuitry (not shown, but similar to select circuit 115 and I/O circuit 116 of FIG. 1) of memory device 300 can operate to provide output information based on the level of signal D on data line 321 (associated with memory cell 301) during time interval 422.

Figure 4B:
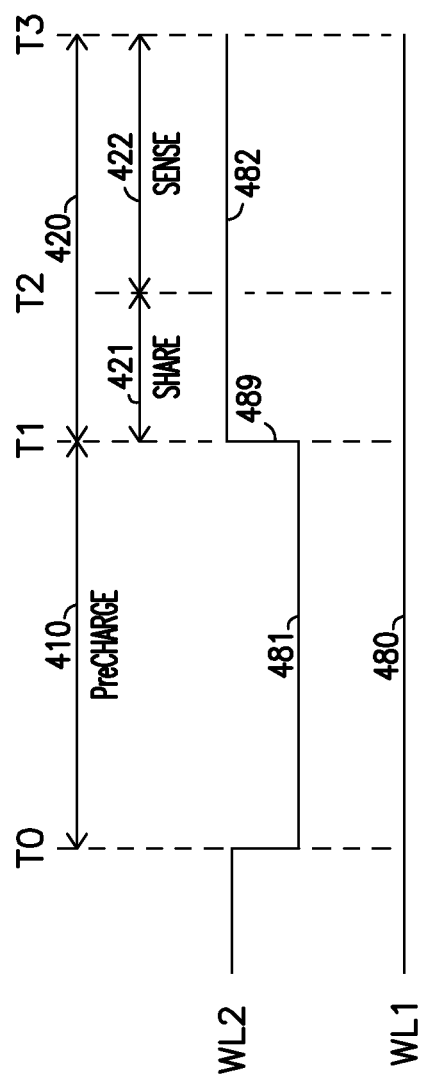

FIG. 4B shows another example timing diagram including waveforms of signals WL1 and WL2 during a memory operation (e.g., a read operation) of memory device 300 of FIG. 3, according to an embodiment of the invention. The example associated with FIG. 4B is the same as that of FIG. 4A except that memory cell 302 in the example associated with FIG. 4B is assumed to be a selected memory cell and memory cell 301 is assumed to be an unselected memory cell. Thus, in the example associated with FIG. 4B, data line 322 can be a selected data line and data line 321 can be an unselected data line. The signals in FIG. 4B can be the same as those in FIG. 4A except for the waveforms for signals WL1 and WL2 in FIG. 4B. For example, in FIG. 4B, signal WL1 can remain unchanged at level 480 during time intervals 410 and 420. Signal WL2 can include different levels, such as a level 481 during time interval 410 and a level 482 during time interval 420.

Figure 5:
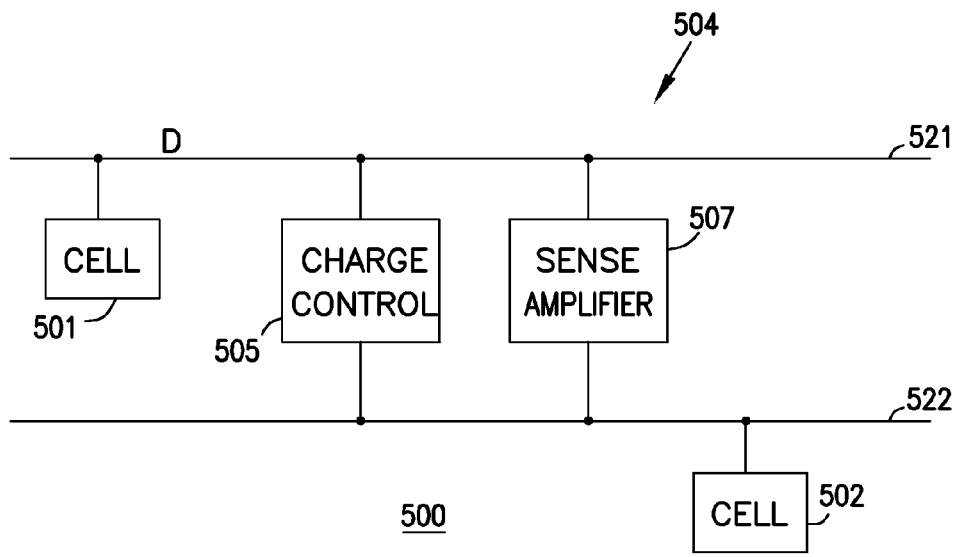
FIG. 5 shows a partial diagram of a memory device, including a charge control circuit and a sense amplifier, according to an embodiment of the invention.

FIG. 5 shows a partial diagram of a memory device 500 including a charge control circuit 505 and a sense amplifier 507, according to an embodiment of the invention. Charge control circuit 505 and a sense amplifier 507 can be included in a portion 504 of a sense circuitry of memory device 500. Charge control circuit 505 and sense amplifier 507 can be coupled to memory cells 501 and 502 through data lines 521 and 522, respectively.

Figure 6A:
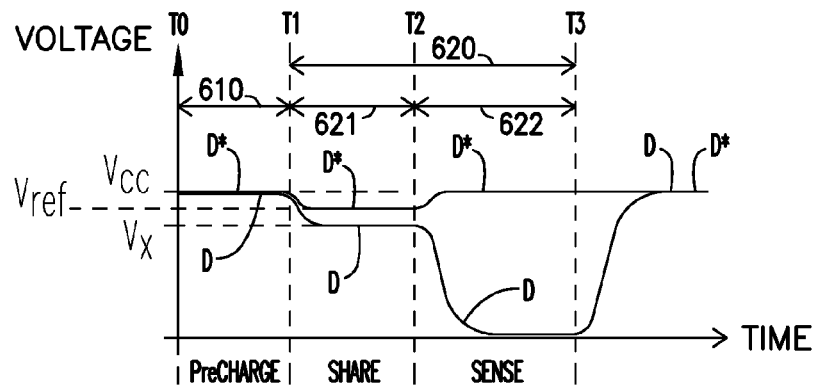
FIG. 6A and FIG. 6B show example timing diagrams, including waveforms of signals on data lines of the memory device of FIG. 5 during a memory operation of the memory device, according to an embodiment of the invention.

FIG. 6A shows example timing diagrams, including waveforms of signals D and D* during an operation (e.g., a read operation) of obtaining information from memory cell 501 of memory device 500 of FIG. 5, according to an embodiment of the invention. The value of information stored in memory cell 501 is assumed to be corresponding to logic 0. FIG. 6A also shows multiple stages, including precharge, charge sharing, and sense stages, of the operation.

As shown in FIG. 6A, the precharge stage can occur during a time interval 610 (e.g., between times T0 and T1), the charge sharing stage can occur during a portion 621 (e.g., between times T1 and T2) of a time interval 620 (e.g., between times T1 and T3), and the sense stage can occur during a portion 622 (e.g., between times T2 and T3) of time interval 620. These multiple stages can correspond to the multiple stages in FIG. 4A. During a read operation associated with FIG. 6A, memory device 500 can apply signals similar to, or identical to, signals WL1 and WL2 to respective access lines (not shown) associated with memory cells 501 and 502.

During the precharge stage, charge control circuit 505 can operate such that each of signals D and D* (FIG. 6A) can include a level corresponding to a voltage equal to voltage Vcc (e.g., a supply voltage of memory device 500).

During the charge sharing stage, charge control circuit 505 can operate such that signal D* on data line 522 (e.g., unselected data line) can include a level corresponding to a voltage Vref. Charge control circuit 505 can also operate such that signal D on data line 521 (e.g., selected data line) can include a level corresponding to a voltage Vx.

During the sense stage, sense amplifier 507 can operate to cause each of signals D and D* to move to an appropriate level, depending on what level each of signals D and D* has at the beginning (e.g., at time T1) of a sense function performed by sense amplifier 507. For example, as shown in FIG. 6A, signal D* can move from a level corresponding to voltage Vref to a level corresponding to voltage Vcc. Signal D can move from a level corresponding to voltage Vx to a level corresponding to voltage V0. After time T3 (e.g., in another precharge stage), signals D and D* can be provided the level corresponding to voltage Vcc.

Figure 6B:
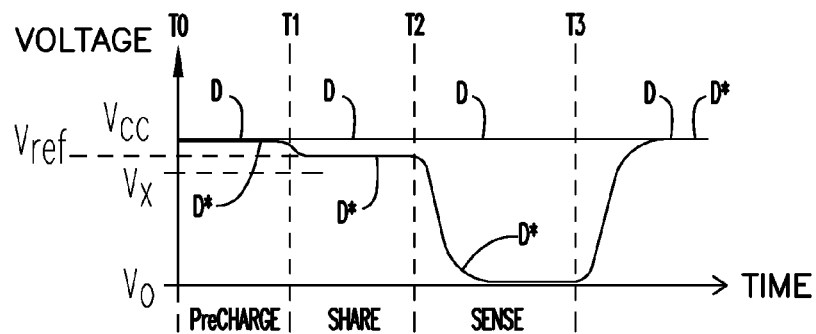
Figure 9:
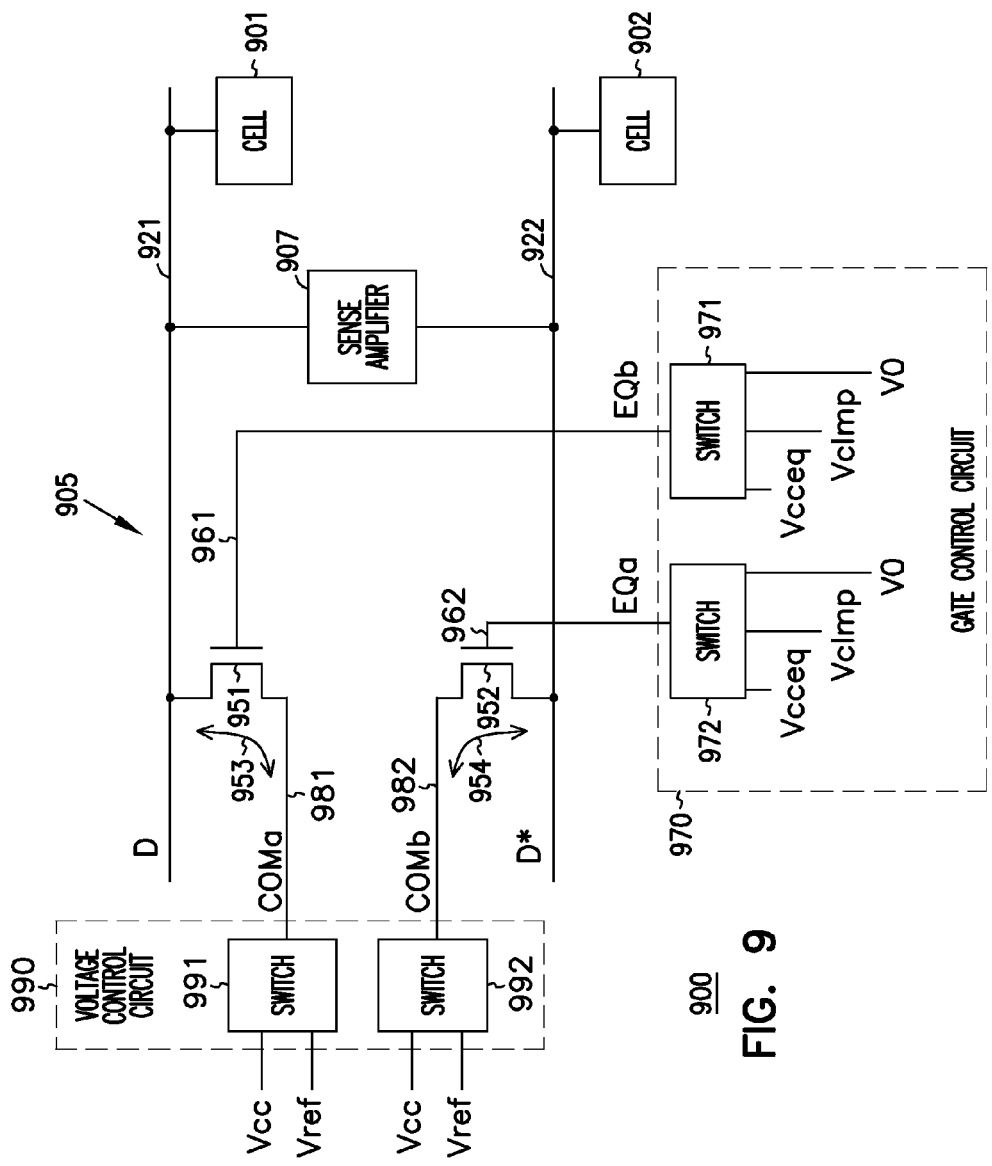
FIG. 9 shows a partial diagram of a memory device, including a schematic diagram of a charge control circuit, according to an embodiment of the invention.

FIG. 6B shows another example timing diagrams during a memory operation of the memory device of FIG. 9, according to an embodiment of the invention. The example associated with FIG. 6B is the same as that of FIG. 6A except that the value of information stored in memory cell 501 (selected memory cell) in the example associated with FIG. 6B is assumed to be corresponding to logic 1 (instead of logic 0 as in the example associated with FIG. 6A). Since the value of information stored in memory cell 501 is assumed to be corresponding to logic 1, signals D and D* can include levels that can be different from those shown in FIG. 6A. For example, in FIG. 6B, signal D can remain at approximately the same level that corresponds to voltage Vcc during the precharge, charge sharing, and sense stages of the operation of obtaining information from memory cell 501. Signal D* can change from a level corresponding to voltage Vcc during the precharge stage to a level corresponding to voltage Vref during the charge sharing stage. Then, signal D* can change from a level corresponding to voltage Vref during the charge sharing stage to a level corresponding to voltage V0 during the sense stage.

In the example associated with FIG. 6A and FIG. 6B, the difference between Vcc and Vref (e.g., Vcc−Vref) and difference between Vref and Vx (e.g., Vref−Vx) can be used as different margins (e.g., sensing margins) for safely determining different values (e.g., logic 1 and logic 0) of information stored in a selected memory cell. For example, the difference between Vcc and Vref (e.g., FIG. 6B) can be used to as one margin for safely determining logic 1 value and difference between Vref and Vx (e.g., FIG. 6A) can be used to as another margin for safely determining logic 0 value.

Figure 7:
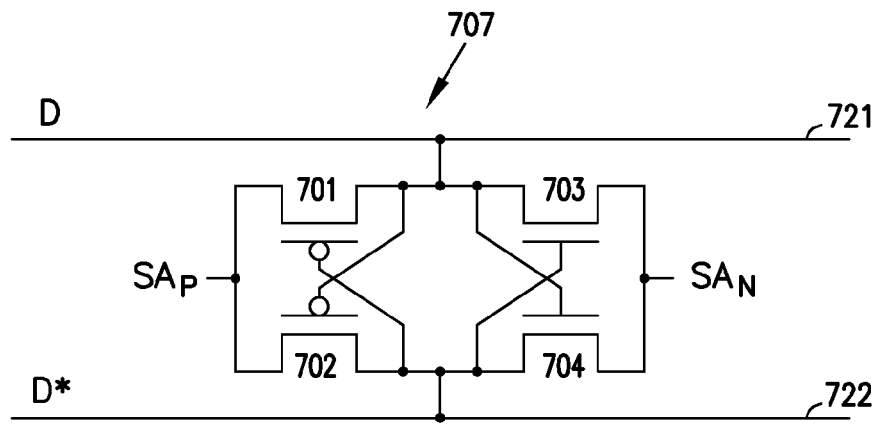
FIG. 7 shows a partial diagram of a memory device, including a schematic diagram of a sense amplifier, according to an embodiment of the invention.

FIG. 7 shows a partial diagram of a memory device 700 including a sense amplifier 707, according to an embodiment of the invention. Sense amplifier 707 can be substituted for any of the sense amplifiers described above, such as sense amplifier 207, 307, and 507 of FIG. 2, FIG. 3, and FIG. 5, respectively. In FIG. 7, sense amplifier 707 includes transistors 701, 702, 703, and 704 coupled to data lines 721 and 722. Transistors 701 and 702 can include p-channel transistors. Transistors 03 and 704 can include n-channel transistors. Sense amplifier 707 can receive signals $SA_N$ and $SA_P$ and perform a sense function to sense signals D and D* on data lines 721 and 722, respectively. Based on the levels of signals D and D*, the value of information stored in a selected memory cell (e.g., a memory cell associated with data line 721 or 722) can be determined.

Figure 8:
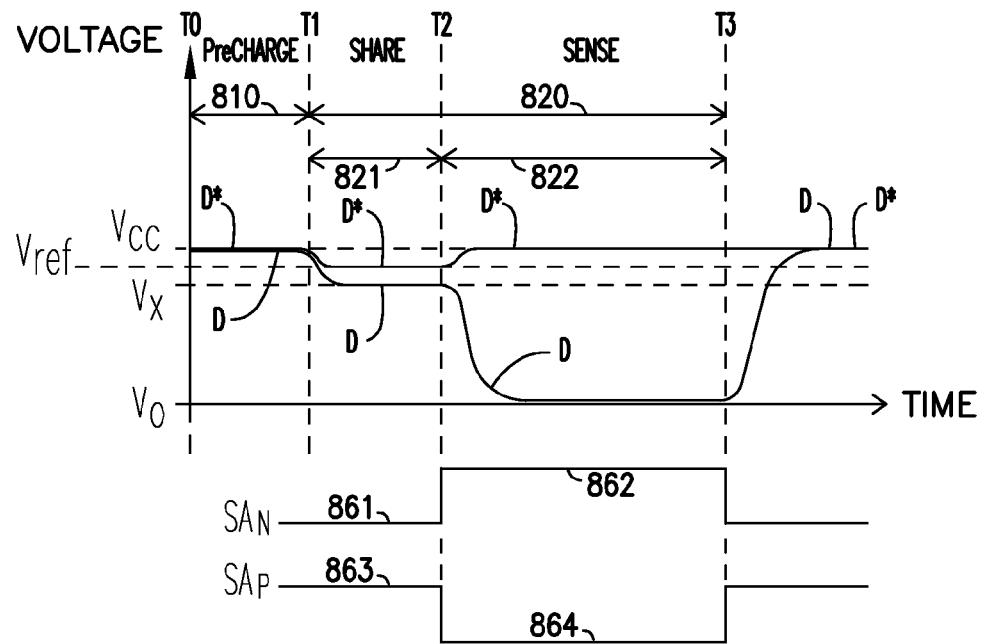
FIG. 8 shows an example timing diagram, including waveforms of signals on data lines and signals provided to the sense amplifier of the memory device of FIG. 7, according to an embodiment of the invention.

FIG. 8 shows an example timing diagram including waveforms of signals D, D*, $SA_N$, and $SA_D$ during a memory operation of memory device 700 of FIG. 7, according to an embodiment of the invention. FIG. 8 also shows multiple stages (e.g., precharge, share, and sense) of the memory operation. The precharge stage can occur during time interval 810 (between times T0 and T1). The charge sharing stage can occur during portion 821 (e.g., between T1 and T2) of time interval 820 (between times T1 and T2). The operation (e.g., read operation) of memory device 700 during sense stage can occur during portion 822 (e.g., between T2 and T3) of time interval 820. The multiple stages in FIG. 8 can be similar to, or identical to, those described above with reference to FIG. 3 through FIG. 6B. Voltage values Vcc, Vref, Vx, and, V0 in FIG. 8 can be similar to, or identical to, those of FIG. 6A. Thus, a detailed description of the waveforms of signals D and D* is omitted here for simplicity.

Signals $SA_N$ and $SA_D$ can be provided with levels 861 and 863, respectively, during the precharge and charge sharing stages, such that sense amplifier 707 can be in an inactive state. During the sense stage, signals $SA_N$ and $SA_D$ can be provided with levels 862 and 864, respectively, such that sense amplifier 707 can be in an active state. Sense amplifier 707 can change from one state (e.g., in active state) to another state (e.g., active state) at a time (e.g., at time T2) between the charge sharing stage and the sense stage based on the levels of signals $SA_N$ and $SA_D$. For example, at time T2, signal $SA_N$ can change from level 861 to level 862. Signal $SA_D$ can change from level 863 to level 864. In response to these changes (e.g., at time T2) in the levels of signals $SA_N$ and $SA_D$, sense amplifier 707 can operate to cause signals D and D* to move to appropriate levels, as shown in FIG. 8. Time T2 can be referred to as the time that sense amplifier 707 is activated to begin the sense function. FIG. 8 shows an example where signals $SA_N$ and $SA_D$ change levels at the same time (e.g., T2). However, signals $SA_N$ and $SA_D$ change levels at different times. For example, signal $SA_P$ can change from level 861 to level 862 at time T2 and signal $SA_P$ can change from level 863 to level 864 after signal $SA_N$ changes levels (e.g., shortly after time T2).

In FIG. 8, the waveforms of signals D and D* are shown with the assumption that, as mentioned above, the selected memory cell associated with data line 721 has a value corresponding to logic 0. If the selected memory cell associated with data line 721 has a value corresponding to logic 1, then the waveforms of signals D and D* can be similar to, or identical, to those of FIG. 6B.

FIG. 9 shows a partial diagram of a memory device 900 including a schematic diagram of a charge control circuit 905, according to an embodiment of the invention. Charge control circuit 905 can be substituted for any of the charge control circuits described above, such as charge control circuit 205, 305, and 505 of FIG. 2, FIG. 3, and FIG. 5, respectively. Memory device 900 can use charge control circuit 905 to control the charge on the data line during an operation (e.g., a read operation) of obtaining information from a memory cell 901 (e.g., associated with a data line 921) or a memory cell 902 (e.g., associated with a data line 922). Memory device 900 can also include a sense amplifier 907 to perform a sense function on data lines 921 and 922 during the operation of obtaining information from memory cell 901 or memory cell 902.

As shown in FIG. 9, charge control circuit 905 can include transistors (e.g., n-channel transistors) 951 and 952. Transistors 951 and 952 can include separate gates to receive different signals. For example, transistor 951 can include a gate 961 to receive a signal EQa and form a conductive path 953 between data line 921 and a node 981. Conductive path 953 can include a conductive portion going through transistor 951 (e.g., going from the source to the drain of transistor 951). Transistor 952 can include a gate 962 to receive a signal EQb and form a conductive path 954 between data line 922 and a node 982. Conductive path 954 can include a conductive portion going through transistor 952 (e.g., going from the source to the drain of transistor 952). Thus, as shown in FIG. 9, gate 961 is not coupled to gate 962.

Memory device 900 can include a gate control circuit 970 to apply signals EQa and EQb to gates 961 and 962, respectively. Gate control circuit 970 can include a switch 971 to control signal EQa, such as by causing signal EQa to change between different levels corresponding to different voltages, such as voltage Vcceq, Vclmp, and V0. Gate control circuit 970 can include a switch 972 to control signal EQb, such as by causing signal EQb to change between different levels corresponding to different voltages, such as voltages Vcceq, Vclmp, and V0. Memory device 900 can internally generate voltages Vcceq, Vclmp, and V0. For example, memory device 900 can include a voltage generator (which can be similar to the voltage generator 119 of FIG. 1) to generate voltages Vcceq, Vclmp, and V0.

As described in more detail below with reference to FIG. 10A through FIG. 10D, gate control circuit 970 can cause each of signals EQa and EQb to be at a level corresponding to one of voltages Vcceq, Vclmp, and V0 during a particular stage among the precharge, charge sharing, and sense stages of the operation. This, however, depends on which of memory cells 901 and 902 is a selected memory cell during an operation (e.g., read operation) of memory device 900. During the same stage of an operation (e.g., during one of the precharge, charge sharing, and sense stages), gate control circuit 970 can cause signals EQa and EQb to be at different levels (e.g., different levels corresponding voltages Vcceq, Vclmp, and V0).

Memory device 900 can include a gate control circuit 990 to apply signals COMa and COMb to nodes 981 and 982, respectively. Voltage control circuit 990 can include a switch 991 to control signal COMa, such as by causing signal COMa to change between different levels corresponding to different voltages (e.g., voltages Vcc and Vref). Voltage control circuit 990 can include a switch 992 to control signal COMb, such as by causing signal COMb to change between different levels corresponding to voltages Vcc and Vref. Voltage Vcc can include a supply voltage of memory device 900. A voltage generator of the memory device 900 can internally generate Voltage Vref.

As described in more detail below with reference to FIG. 10A through FIG. 10D, voltage control circuit 990 can cause each of the signals COMa and COMb to be at a level corresponding to either voltage Vcc or voltage Vref during a particular stage among the precharge, charge sharing, and sense stages of the memory operation. This, however, depends on which of memory cells 901 and 902 is a selected memory cell during a memory operation (e.g., read operation) of the memory device 900.

Memory device 900 can include a memory control unit (which can be similar to memory control unit 118 of FIG. 1) to control (e.g., turn on or off) switches 971, 972, 991, and 992 during a memory operation in order to cause signals EQa, EQb, COMA, and COMb to be at appropriate levels during the memory operation, such as at the levels shown and described below with reference to FIG. 10A through FIG. 10D.

Figure 10A:
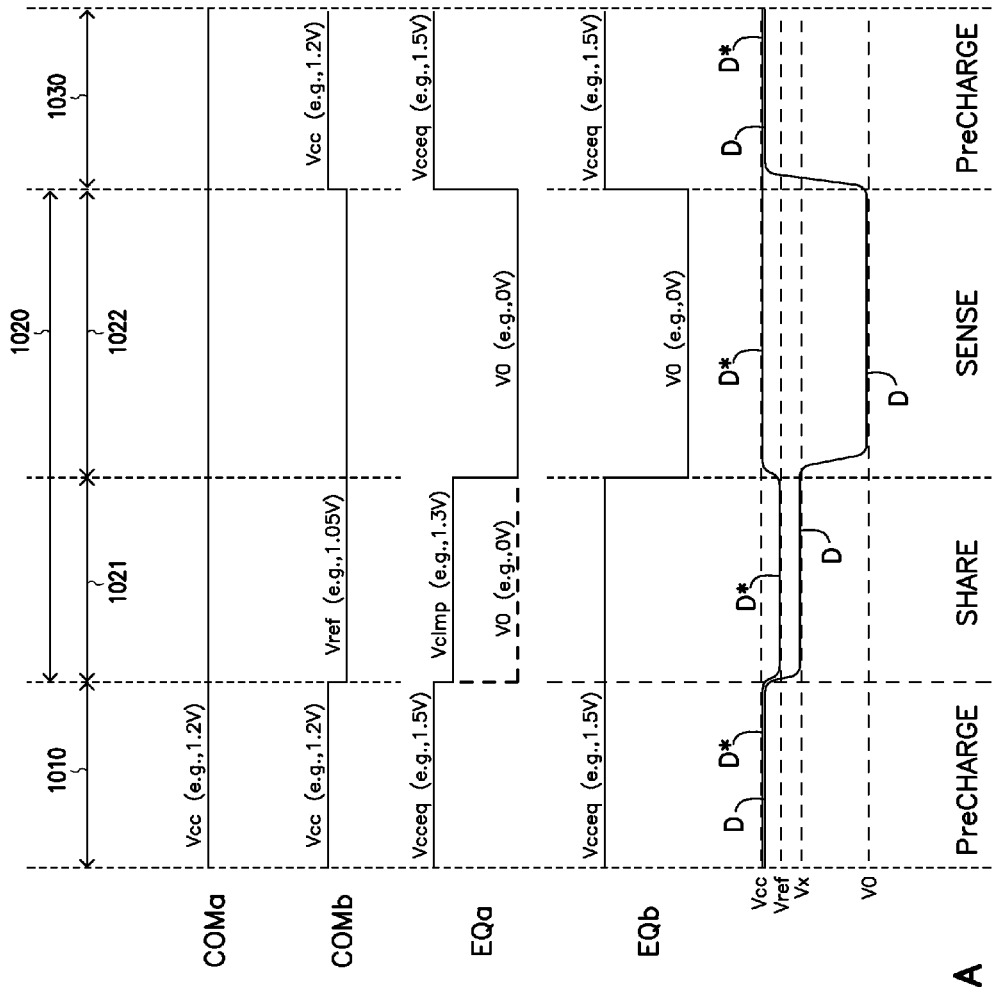
FIG. 10A through FIG. 10D show example timing diagrams during a memory operation of the memory device of FIG. 9, according to an embodiment of the invention.

FIG. 10A shows example timing diagrams during a memory operation of memory device 900 of FIG. 9, according to an embodiment of the invention. In the example associated with FIG. 10A, memory cell 901 is assumed to be a selected memory cell, and the value of information stored in memory cell 901 is assumed to be corresponding to logic 0. Memory cell 902 is assumed to be an unselected memory cell.

The values of the voltages shown in FIG. 10A are example values. Other values may be used. As shown in FIG. 10A, voltage Vcc can have a value of approximately 1.2V. Voltage Vref can be less than voltage Vcc and greater than one half of voltage Vcc (e.g., Vref>½ Vcc). For example, voltage Vref can have a value of approximately 1V to 1.1V. Voltage Vcceq can be greater than voltage Vcc. For example, voltage Vcceq can have a value of approximately 1.5V. Voltage Vclmp can be greater than voltage Vcc and less than voltage Vcceq (e.g., Vcc<Vclmp<Vcceq). For example, voltage Vclmp can have a value of approximately 1.3V to 1.4V. Voltage V0 can have ground potential (e.g., V0=0).

The following description refers to FIG. 9 and FIG. 10A. As shown in FIG. 10A, an operation of obtaining information in memory cell 901 (selected memory cell in this example) can include a precharge stage (which can occur during a time interval 1010), a charge sharing stage (which can occur during a portion 1021 of a time interval 1020), and a sense stage (which can occur during a portion 1022 of time interval 1020). After the sense stage, memory device 900 may repeat the process (e.g., repeat the stages starting with another precharge stage 1030) to obtain information from another memory cell associated with data line 921 or 922.

As shown in FIG. 10A, signal COMa can have the same level during the precharge, charge sharing, and sense stages. For example, signal COMa can include a level corresponding to voltage Vcc during the precharge stage (e.g., during time interval 1010). Signal COMa can be kept unchanged (e.g., kept at the level corresponding to voltage Vcc) between the precharge and the charge sharing stages and between the charge sharing and the sense stages.

Signal COMb can have one level during the precharge stage and another level during the charge sharing and sense stages. For example, signal COMb can include a level corresponding to voltage Vcc during the precharge stage (e.g., during time interval 1010). Signal COMb can be changed from the level corresponding to voltage Vcc (during the precharge stage) to a level corresponding to voltage Vref (during the charge sharing stage). Signal COMb can be kept unchanged (e.g., kept at the level corresponding to voltage Vref) between the charge sharing stage and sense stage.

Signal EQa can include a different level in each of the precharge, charge sharing, and sense stages. For example, signal EQa can include a level corresponding to voltage Vcceq during the precharge stage (e.g., during time interval 1010). Signal EQa can be changed from the level corresponding to voltage Vcceq (during the precharge stage) to a level corresponding to voltage Vclmp (during the charge sharing stage). Signal EQa can be changed from the level corresponding to voltage Vclmp (during the charge sharing stage) to a level corresponding to voltage V0 (during the sense stage).

Signal EQb can have one level during the precharge and charge sharing stages and another level during the sense stage. For example, signal EQb can include a level corresponding to voltage Vcceq during the precharge stage (e.g., during time interval 1010). Signal EQb can be kept unchanged (e.g., kept at the level corresponding to voltage Vcceq) between the precharge stage and the charge sharing stage. Signal EQb can be changed from the level corresponding to voltage Vcceq (during the charge sharing stage) to a level corresponding to voltage V0 during the sense stage.

The levels of signals D and D* during the example associated with FIG. 10A can be similar to those of FIG. 6A and FIG. 8. During the precharge stage in FIG. 9 and FIG. 10A, transistor 951 can turn on and form conductive path 953 between data line 921 and node 981 in response to signal EQa being at a level corresponding to voltage Vcc. Thus, during the precharge stage, signal D on data line 921 can include a level corresponding to the voltage (e.g., Vcc) at node 981.

Transistor 952 can turn on and form conductive path 954 between data line 922 and node 981 in response to signal EQb being at a level corresponding to voltage Vcc during the precharge stage. Thus, during the precharge stage, signal D* can include a level corresponding to the voltage (e.g., Vcc) at node 982.

During the charge sharing stage, memory cell 901 (selected memory cell) and data line 921 (selected data line) can share charge with each other. Memory cell 901 can include an access transistor and a memory element similar to access transistor 303 and memory element 314 of FIG. 3. During the charge sharing stage, the access transistor of memory cell 902 can be turned on. This electrically couples data line 921 to the memory element (e.g., capacitor) of memory cell 901. Since the value of information stored in memory cell 901 is assumed to have a logic 0, the charge (e.g., corresponding to voltage Vcc) on data line 921 can decrease. As shown in FIG. 10A, signal D can change from a level corresponding to voltage Vcc to a lower level, such as a level corresponding to voltage Vx. Voltage Vx is less than voltage Vcc.

During the charge sharing stage, the access transistor of memory cell 902 (unselected memory cell) can remain turned off. Thus, data line 922 (unselected data line) is not electrically coupled to the memory element of memory cell 902. Therefore, memory cell 902 and data line 922 may not share charge with each other. The signal D* on data line 922 can include a level corresponding to the voltage (e.g., Vref) at node 982.

During the sense stage, transistors 951 and 952 can turn off in response to signals EQa and EQb being at a level corresponding to voltage V0. Thus, conductive path 953 between data line 921 and node 981 and conductive path 954 between data line 922 and node 982 may no longer be formed. In the sense stage, sense amplifier 907 can operate to cause signals D and D* to move to appropriate levels, such as levels corresponding to voltages V0 and Vcc, respectively.

During the charge sharing stage of an operation, such as a read operation associated with the example of FIG. 10A, capacitive coupling between a selected data line (e.g., data line 921 in FIG. 9) and an adjacent data line may introduce signal noise. The adjacent data line includes a data line (e.g., not a reference data line 922) of memory device 900 that is physically located immediately next to the selected data line. The signal noise between the selected data line and the adjacent data line may be more prominent (e.g., may have a relatively higher noise value) in one situation than in another situation. This may depends on the values of information stored in the selected memory cell and the adjacent memory cell. For example, the signal noise may be more prominent in a situation where the value of the information stored in the selected memory cell (e.g., 901 in FIG. 9) corresponds to a logic 0 and the value of the information stored in the adjacent memory cell corresponds to another value (e.g., a logic 1). The signal noise in such a situation may affect the sense function on the selected data line. For example, the signal noise may cause an imbalance in sensing margins for determining different values (e.g., logic 1 and logic 0) stored in the selected memory cell. Such an imbalance may affect the sensing function (e.g., may decrease the accuracy to the sensing function).

Reducing the noise signal during the charge sharing stage may improve the sense function in some situations. One of such situations can be similar to that of the example associated with FIG. 10A where the information stored in memory cell 901 (selected memory cell) is assumed be corresponding to a logic 0. As shown in FIG. 10A, the level of signal D (associated with data line 921) during the charge sharing stage corresponds to voltage Vx. The signal noise can be reduced by selecting the value voltage Vx to be relatively closer to the value of voltage Vcc and by selecting the value of voltage Vref to be at approximately the midpoint between the values of voltages Vcc and voltage Vx. This selection of the values of voltage Vx and Vref is taken with a condition that the difference between Vcc and Vref (e.g., Vcc−Vref) and difference between Vref and Vx (e.g., Vref−Vx) can be still be at appropriate values to maintain safe sensing margins for determining different values (e.g., logic 0 and logic 1) of information stored in the selected memory cells.

The value of Vx can be dependent on the value of voltage Vclmp. As shown in the charge sharing stage in FIG. 10A, signal EQa has a level corresponding to voltage Vclmp. As shown in FIG. 9, since signal EQa can be applied to gate 961 of transistor 951 (which is turned on during the charge sharing stage) to cause signal D to be at level corresponding to level Vx. Thus, by selecting an appropriate value for voltage Vclmp, the value of voltage Vx can be selected (e.g., indirectly selected). As an example, the value of voltage Vclmp can be selected to be at approximately 1.3V and the value of voltage Vref can voltage selected to be at approximately 1.05V, such that value of voltage Vx can be approximately 0.9V when voltage Vcc is approximately 1.2V.

FIG. 10A also shows an alternative level for signal EQa during the charge sharing stage. For example, signal EQa can alternatively be changed from a level corresponding to voltage Vcc to a level corresponding to voltage V0 (shown as a dashed line) during the charge sharing stage instead of causing signal EQa to change from a level corresponding to voltage Vcc to a level corresponding to voltage Vclmp (shown a solid line). In comparison with causing signal EQa to be at a level corresponding voltage Vclmp, causing the signal EQa to be at a level corresponding to voltage V0 may result in a larger difference between Vcc and Vref and a larger difference between Vref and Vx. Such larger differences may still maintain the safe sensing margins. However, it may result in a higher signal noise in comparison to that of the situation where signal EQa has a level corresponding voltage Vclmp.

Figure 10B:
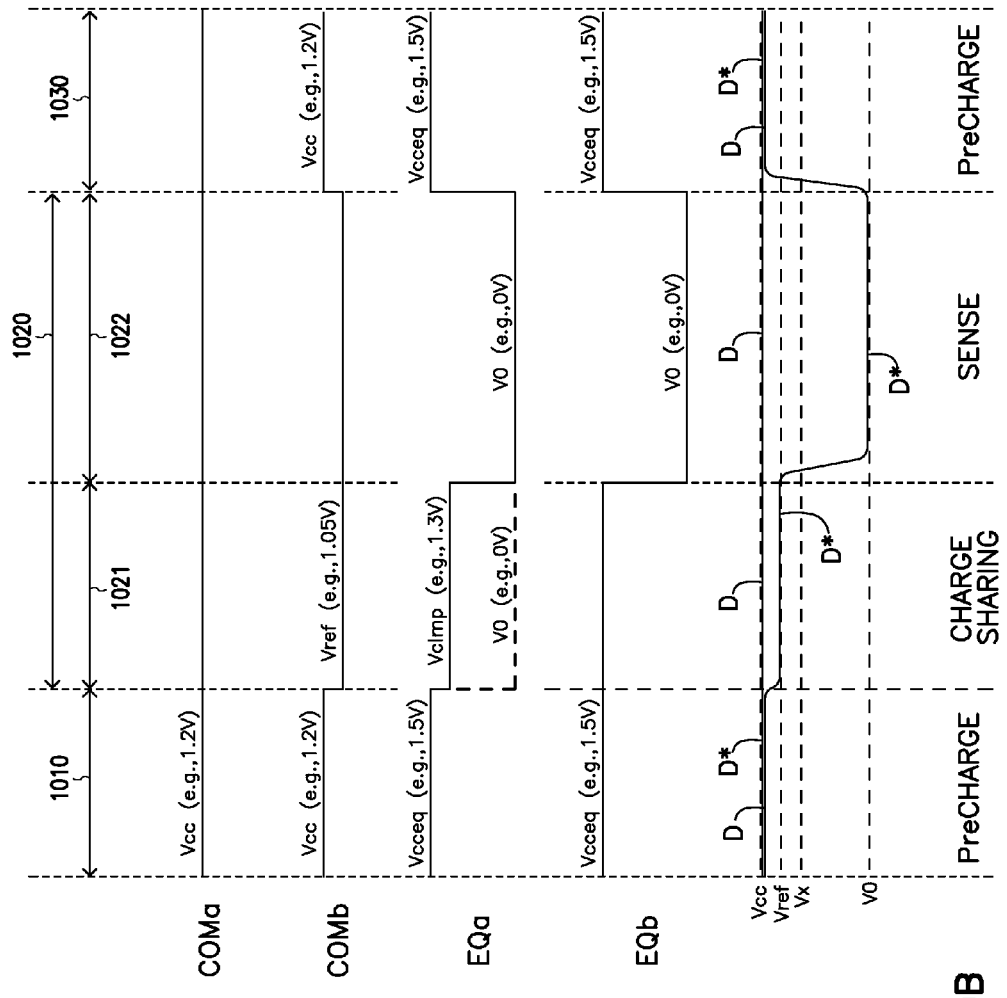

FIG. 10B shows another example timing diagram during a memory operation of memory device 900 of FIG. 9, according to an embodiment of the invention. The example associated with FIG. 10B is the same as that of FIG. 10A except that the value of information stored in memory cell 901 (selected memory cell) in the example associated with FIG. 10B is assumed to be corresponding to logic 1 (instead of logic 0 as in the example associated with FIG. 10A). Since the value of information stored in memory cell 901 is assumed to be corresponding to logic 1, signals D and D* can include levels that can be different from those shown in FIG. 10A. For example, in FIG. 10B, signal D can remain at approximately the same level that corresponds to voltage Vcc during the precharge, charge sharing, and sense stages of the operation of obtaining information from memory cell 901. Signal D* can change from a level corresponding to voltage Vcc during the precharge stage to a level corresponding to voltage Vref during the charge sharing stage. Signal D* can, then, change from a level corresponding to voltage Vref during the charge sharing stage to a level corresponding to voltage V0 during the sense stage. Other signals, such as COMa, COMb, EQa, and EQb, can be similar to, or identical to, those of FIG. 10A.

Figure 10C:
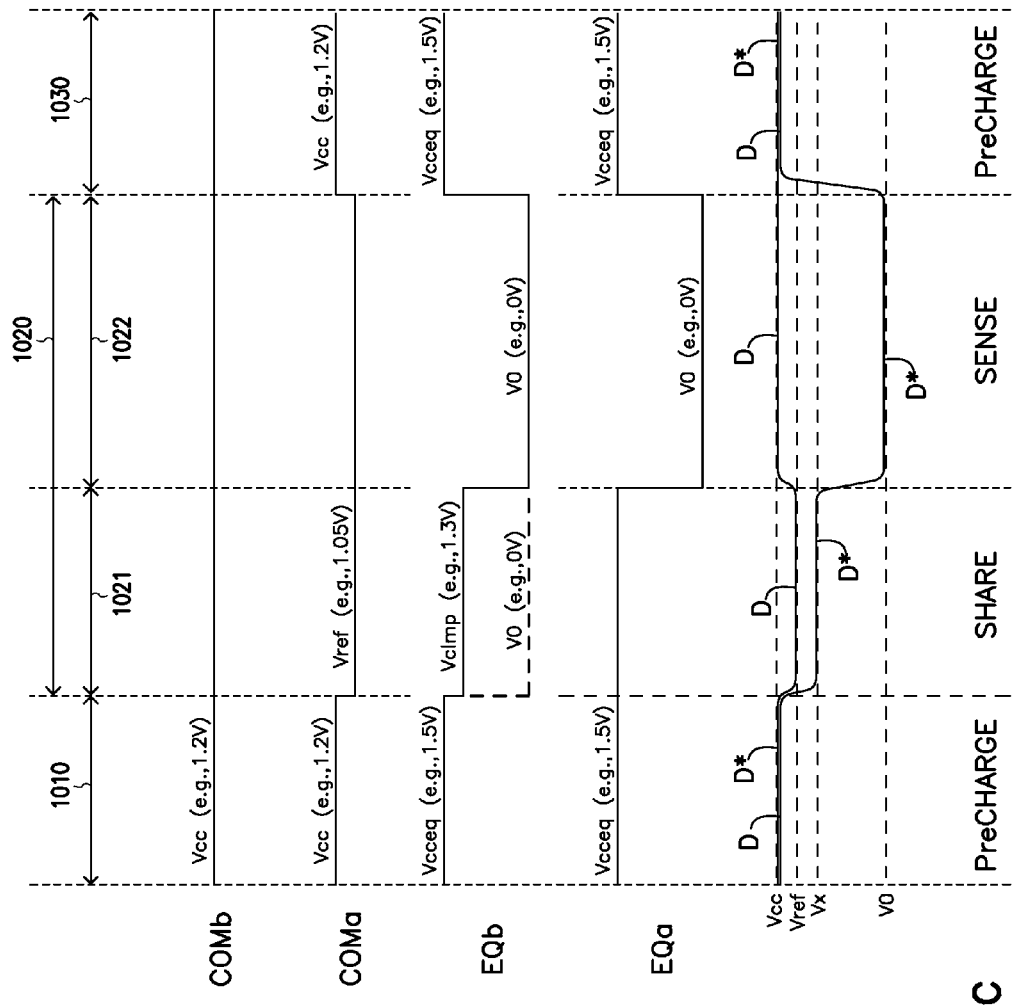
Figure 10D:
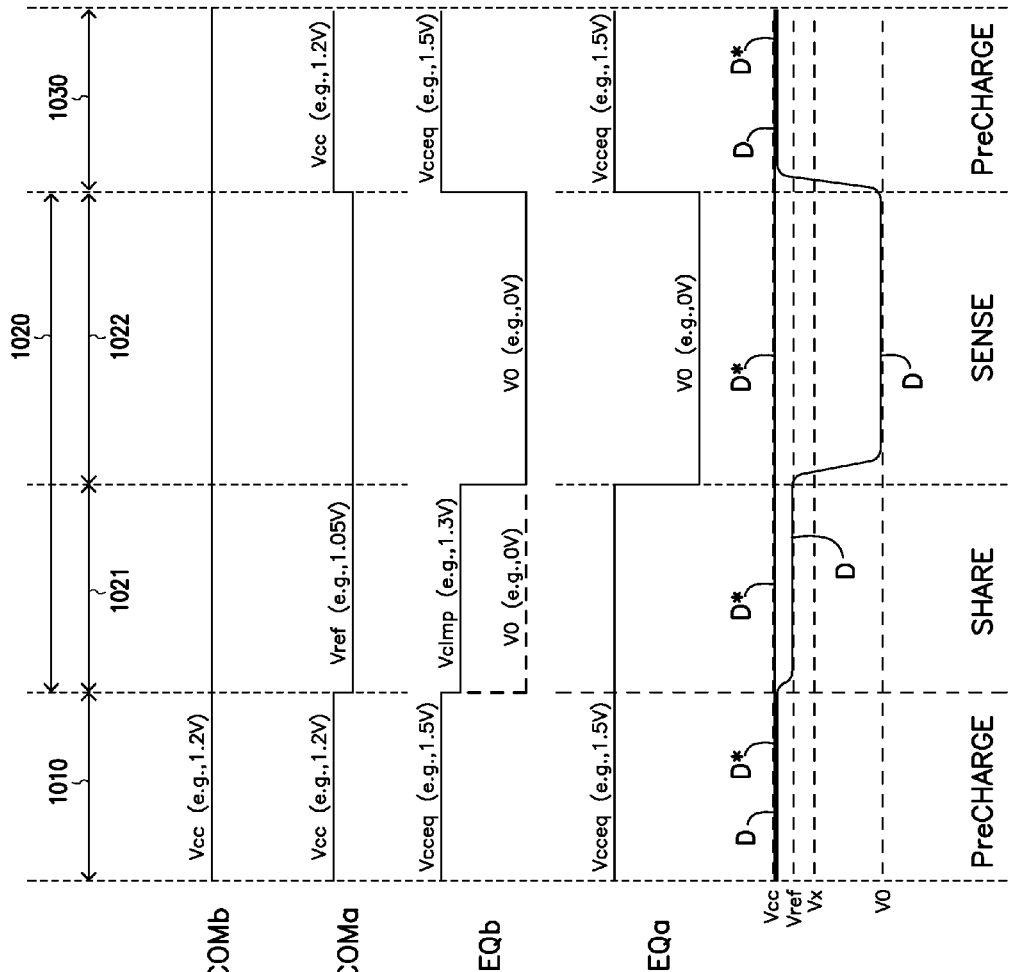

FIG. 10C and FIG. 10D show additional example timing diagrams during a memory operation of memory device 900 of FIG. 9, according to an embodiment of the invention. The example associated with FIG. 10C is the same as that of FIG. 10A except that memory cell 902 in the example associated with FIG. 10C is assumed to be a selected memory cell and memory cell 901 is assumed to be an unselected memory cell. Thus, in the example associated with FIG. 10C, data line 922 can be a selected data line and data line 921 can be an unselected data line. The signals in FIG. 10C can be the same as those in FIG. 10A except that the waveforms for the signals are swapped. For example, the waveforms for signals COMa and COMb in FIG. 10A are swapped in FIG. 10C. The waveforms for signals EQa and EQb in FIG. 10A are swapped in FIG. 10C. The waveforms for signals D and D* in FIG. 10A are swapped in FIG. 10C.

The example associated with FIG. 10D is the same as that of FIG. 10C except that the value of information stored in memory cell 902 (selected memory cell) in the example associated with FIG. 10D is assumed to be corresponding to logic 1 (instead of logic 0 as in the example associated with FIG. 10C). Since the value of information stored in memory cell 902 is assumed to be corresponding to logic 1, signals D and D* can include levels that can be different from those shown in FIG. 10C. For example, in FIG. 10D, signal D can remain at approximately the same level that corresponds to voltage Vcc during the precharge, charge sharing, and sense stages of the operation of obtaining information from memory cell 901. Signal D* can change from a level corresponding to voltage Vref to a level corresponding to voltage V0. Other signals, such as COMa, COMb, EQa, and EQb, can be similar to, or identical to, those of FIG. 10C.

The illustrations of apparatuses (e.g., memory devices 100, 200, 300, 500, 700, and 900) and methods (e.g., method of operations performed by memory devices 100, 200, 300, 500, 700, and 900) are intended to provide a general understanding of the structure of various embodiments and are not intended to provide a complete description of all the elements and features of an apparatus that might make use of the structures described herein.

The apparatuses (e.g., memory devices 100, 200, 300, 500, 700, and 900, including memory control unit 118 of FIG. 1) described above may all be characterized as "modules" (or "module"). Such modules may include hardware circuitry, single and/or multi-processor circuits, memory circuits, software program modules, objects, and/or firmware, and combinations thereof, as desired and/or as appropriate for particular implementations of various embodiments.

Memory devices 100, 200, 300, 500, 700, and 900 may be included in apparatuses (e.g., electronic circuitry) such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others The embodiments described above with reference to FIG. 1 through FIG. 10D include apparatuses and methods having a first data line, a second data line, a first transistor, a sense amplifier, and a circuit. The first transistor can operate to couple the first data line to a first node during a first stage of an operation of obtaining information from a memory cell associated with the first data line. The second transistor can operate to couple the second data line to a second node during the first stage. The circuit can operate to apply a first signal to a gate of the first transistor during the operation and to apply a second signal to a gate of the second transistor during the operation. The sense amplifier can operate to perform a sense function on the first and second data lines during a second stage of the operation. Other embodiments, including additional apparatuses and methods, are described.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description.

What is claimed is:

1. An apparatus comprising:
   a first data line;
   a second data line;

a first transistor to couple the first data line to a first node during a first stage of an aeration of obtaining information from a memory cell associated with the first data line;

a second transistor to couple the second data line to a second node during the first stage;

a circuit to apply a first signal to a gate of the first transistor during the operation and to apply a second signal to a gate of the second transistor during the operation; and a sense amplifier to perform a sense function on the first and second data lines during a second stage of the operation, wherein the circuit is configured to apply the first and second signals, such that the first signal includes a first level during the first stage, and the second signal includes a second level during the first stage.

2. The apparatus of claim 1, wherein each of the first and second level corresponds to a positive voltage.

3. The apparatus of claim 1, wherein the first level corresponds to ground potential.

4. An apparatus comprising:
a first data line;
a second data line;
a first transistor to couple the first data line to a first node during a first stage of an aeration of obtaining information from a memory cell associated with the first data line;
a second transistor to couple the second data line to a second node during the first stage;
a circuit to apply a first signal to a gate of the first transistor during the operation and to apply a second signal to a gate of the second transistor during the operation;
a sense amplifier to perform a sense function on the first and second data lines during a second stage of the operation; and
an additional circuit to apply a first additional signal including a first level to the first node during the first stage and to apply a second additional signal including a second level to the second node during the first stage.

5. The apparatus of claim 4, wherein the apparatus comprises a memory device, and the additional circuit is configured to apply the first and second additional signals such that each of the first and second additional signals includes a level corresponding to a voltage equal to a supply voltage of the memory device during a stage before the first stage.

6. The apparatus of claim 4, wherein the apparatus comprises a memory device, and the additional circuit is configured to apply the first and second additional signals such that each of the first and second additional signals includes a level corresponding to a voltage equal to a supply voltage of the memory device during a stage after the second stage.

7. An apparatus comprising:
a memory cell;
a data line;
a transistor including a gate to receive a signal and form a conductive path between the data line and a node during at least one of multiple stages of an operation of obtaining information from the memory cell;
a circuit to apply the signal to the gate of the transistor, such that the signal includes a first level during a first stage of the multiple stages, a second level during a second stage of the multiple stages, and a third level during a third stage of the multiple stages; and
a sense amplifier to cause a signal on the data line during the third stage to have a first level if the information stored in the memory cell has a first value and a second level if the information stored in the memory cell has a second value.

8. The apparatus of claim 7, wherein the apparatus comprises a memory device, and the circuit is configured to apply the signal such that each of the first and second levels of the signal at the gate of the transistor corresponds to a voltage greater than a supply voltage of the memory device.

9. The apparatus of claim 7, wherein the apparatus comprises a memory device, and the node is configured to receive a signal including a level corresponding to a voltage greater than one half of a supply voltage of the memory device.

10. The apparatus of claim 7, wherein the apparatus comprises a memory device, and the node is configured to receive a signal including a level corresponding to a voltage equal to a supply voltage of the memory device.

11. The apparatus of claim 7, further comprising an access line to receive an additional signal to access the memory cell during at least one of the first, second, and third stages, the additional signal including a first level during the first stage and a second level during the second and third stages.

12. A method comprising:
applying a signal including a first level to a gate of a first transistor during a first stage of an operation of a memory device to form a conductive path between a data line and a first node;
causing the signal to change from the first level to a second level during a second stage of the operation if a memory cell associated with the data line is selected to obtain information from the memory cell during the operation;
keeping the signal at the first level during the second stage if the memory cell is not selected to obtain information from the memory cell during the operation;
causing the signal to change from one of the first and second levels to a third level during a third stage of the operation; and
performing a sense function on the data line during the third stage.

13. The method of claim 12, further comprising:
providing a value of the information stored in the memory cell based on a level of a signal on the data line if the memory cell is selected to obtain information from the memory cell during the operation.

14. The method of claim 12, further comprising:
applying an additional signal to the first node during the operation;
causing the additional signal to change from a first level during the first stage to a second level during the second stage if the memory cell is not selected to obtain information from the memory cell during the operation; and
keeping the additional signal at a same level between the first and second stages if the memory cell is selected to obtain information from the memory cell during the operation.

* * * * *